United States Patent [19]

Charton et al.

[11] Patent Number: 4,859,942

[45] Date of Patent: Aug. 22, 1989

[54] CIRCUIT ARRANGEMENT FOR SENSING THE DISPLACEMENT OF A MOVABLE IRON CORE RELATIVE TO A MAGNETIC COIL BY MEASURING THE DECAY TIME OF A CONSTANT CURRENT FLOWING THROUGH THE MAGNETIC COIL

[75] Inventors: René Charton, Garbsen; Berend Kleen, Hanover, both of Fed. Rep. of Germany

[73] Assignee: WABCO Westinghouse Fahrzeugbremsen GmbH, Hanover, Fed. Rep. of Germany

[21] Appl. No.: 186,851

[22] Filed: Apr. 27, 1988

[30] Foreign Application Priority Data

Apr. 29, 1987 [DE] Fed. Rep. of Germany ....... 3714282
Mar. 4, 1988 [DE] Fed. Rep. of Germany ....... 3807015

[51] Int. Cl.$^4$ .................... G01R 11/52; G01R 27/26; G01B 7/14; G01N 27/72
[52] U.S. Cl. .................................. 324/208; 324/225; 324/59
[58] Field of Search ................. 324/59, 207, 208, 224, 324/225, 418, 424; 340/870.31, 870.32, 870.35, 870.36; 307/116

[56] References Cited

U.S. PATENT DOCUMENTS

| | | | |
|---|---|---|---|
| 4,074,185 | 2/1978 | Dardenne | 324/59 |
| 4,219,740 | 8/1980 | Little | 324/59 |
| 4,258,315 | 3/1981 | Westra | 324/59 |
| 4,649,341 | 3/1987 | Ulbirch et al. | 324/207 |

FOREIGN PATENT DOCUMENTS

| | | |
|---|---|---|
| 1093904 | 9/1958 | Fed. Rep. of Germany . |
| 2037039 | 2/1972 | Fed. Rep. of Germany . |
| 2833141 | 2/1980 | Fed. Rep. of Germany . |
| 2852637 | 6/1980 | Fed. Rep. of Germany . |

Primary Examiner—Reinhard J. Eisenzopf
Assistant Examiner—Walter E. Snow
Attorney, Agent, or Firm—J. B. Sotak

[57] ABSTRACT

The arrangement comprises, a circuit arrangement for measuring the inductance of an inductive displacement or position sensor having a magnetic coil and a magnetic circuit including a movable iron core; a constant controlled current source connected to the magnetic coil; a switch for cutting off the constant controlled current fed to the magnetic coil; a cut-off voltage induced into the coil; and an electronic circuit for measuring the decay time of the current flowing through the coil after the switch is opened. The material for the magnetic circuit and the coil for the inductive displacement sensor is selected such that the temperature coefficients of the coil and the magnetic circuit compensate each other.

9 Claims, 3 Drawing Sheets

CIRCUIT ARRANGEMENT FOR SENSING THE DISPLACEMENT OF A MOVABLE IRON CORE RELATIVE TO A MAGNETIC COIL BY MEASURING THE DECAY TIME OF A CONSTANT CURRENT FLOWING THROUGH THE MAGNETIC COIL

FIELD OF THE INVENTION

The present invention relates to an inductive measuring system and, more particularly, to a circuit arrangement for measuring an inductance value of an inductive displacement sensor having an electric coil, a magnetic circuit, and a movable iron core.

BACKGROUND OF THE INVENTION

There are a number of inductance measurement devices for sensing the position or displacement of a movable member in an inductor. Such inductive displacement sensors normally comprise a magnetic coil containing a movable iron core. The inductance value of the coil depends on the depth of immersion of the core. Therefore, the inductance value is a measure for the displacement of the iron core.

Further, there are a number of electronic circuits which function on the basis of different operating principles for measuring or evaluating the inductance of inductive displacement sensors. For example, published German Patent Applications DE-OS 35 19 978 and DE-OS 33 43 885, the latter of which corresponds to U.S. Pat. No. 4,649,341, show and disclose several types of control circuits for inductive sensors in which a voltage pulse is applied to the inductive coil. This current through the coil then rises from a zero level to a value determined by a current limit. The time period from the beginning of the current rise until the actuation of the current limit is measured with the aid of a suitable microcomputer, which serves as a convenient and efficient means for measuring the inductance of the coil which is used to determine the position of the iron core.

These prior art circuits have the disadvantage that a rise in the ambient temperature in the vicinity of the sensor results in an increase of the resistance of the coil as well as in an increase of the permeability of the movable iron core. Since the two factors cumulatively lead to an increase in the charging time for the inductance, an error occurs in the measuring of the displacement or position of the iron core. A measuring error is particularly serious when the displacement sensor is used in a motor vehicle in which ambient temperatures may vary between $-40°$ to $+80°$ C.

Previously, protective circuts for the sensor coils were included in a negative temperature coefficient (NTC) thermistor network, which is capacitor of compensating for the temperature variations as shown and disclosed in published German Patent Application DE-OS 35 26 560. However, an (NTC) resistance network of this kind leads to additional expense, which is particularly disadvantageous with mass produced components, such as those required for motor vehicles.

OBJECTS AND SUMMARY OF THE INVENTION

Accordingly, the subject has the object of providing an arrangement for measuring an inductance as well as the corresponding circuits while eliminating or at least considerably reducing the undesirable temperature variations of the measuring.

A further object of this invention is to provide an improved circuit arrangement for measuring the displacement of a movable iron core with respect to an inductive coil by sensing the inductance which is indicative of the displacement.

Another object of this invention is to provide an inductive displacement sensor which is not adversely effected by temperature variations.

Yet a further object of this invention is to provide a displacement sensor having a magnetic circuit including a magnetic casing and a movable iron core and having an inductance coil which have offsetting temperature coefficients to nullify temperature variations.

In accordance with the present invention, there is provided a circuit arrangement for measuring an inductance, paritcularly the inductance of an inductive displacement sensor comprising, means for supplying the inductance with a constant controlled current, means for cutting off the constant controlled current and for limiting the cut-off voltage induced in the inductance to a given value, and means for measuring the decay time of the current flowing through the inductance.

DESCRIPTION OF THE DRAWINGS

The above objects and other attendant features and advantages will be more readily appreciated as the present invention becomes better understood by reference to the following detailed description when considered in conjunction with the accompanying drawings, wherein.

DETAILED DESCRIPTION OF THE INVENTION

Figure 1:
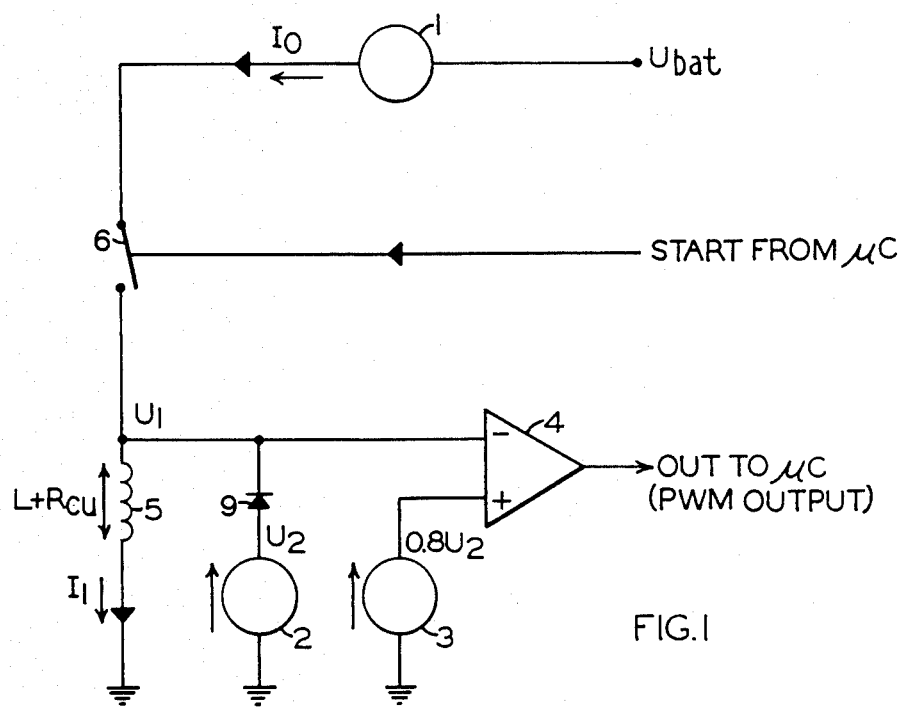
FIG. 1 shows a simplified schematic block diagram illustrating the measuring circuit according to the present invention.

Referring now to the drawings, and particularly to FIG. 1, it is assumed that the displacement measuring circuit is in a state of acquiesce condition so that a steady-state current $I_1$ flows through coil 5 of an inductor and over a switch 6 which is initially closed. The coil 5 encompasses a movable magnetic iron core and has an inductance L and an ohmic resistance $R_{cu}$. The current $I_1$ is generated by a suitable voltage source $U_{bat}$, which may be 24 volts, and is limited to a constant value of $I_O$, which may be 50 mA by means of a constant current source 1. Thus, a voltage $U_1$ is developed at the upper end of the coil 5. The steady-state value of $U_1$ is equal to 3.5 volts where $U_1 = I_O \cdot R_{cu}$. The steady-state power consumed in the coil 5 would be 50 mA·3.5 V = 175 mW.

A voltage $U_2$ of the potential source 2 is equal to 10 volts. It will be seen that a diode 9 is connected in series with the voltage source 2, and that they both are connected parallel with the coil 5. A second voltage source 0.8 $U_2$ of a potential source 3 is connected to a positive (+) input terminal of comparator 4. The negative (−) input terminal of the comparator 4 is connected to the upper end of the coil 5 having the movable core. Thus, voltage source 3 and the comparator 4 are connected in parallel with the coil of the inductor 5.

Figure 2:
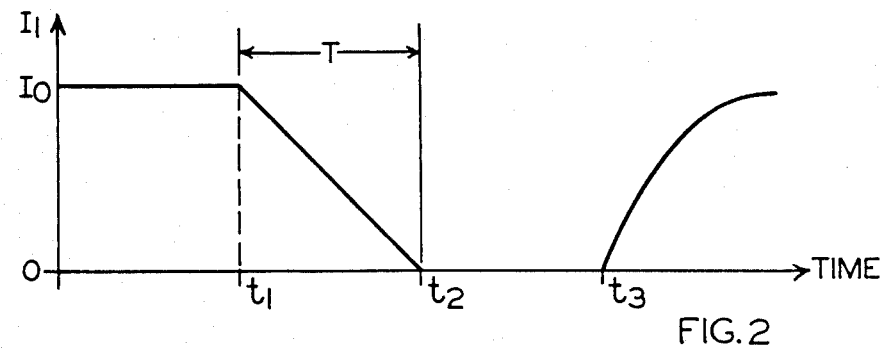
FIG. 2 is a graphic illustration of the coil current versus time.
Figure 3:
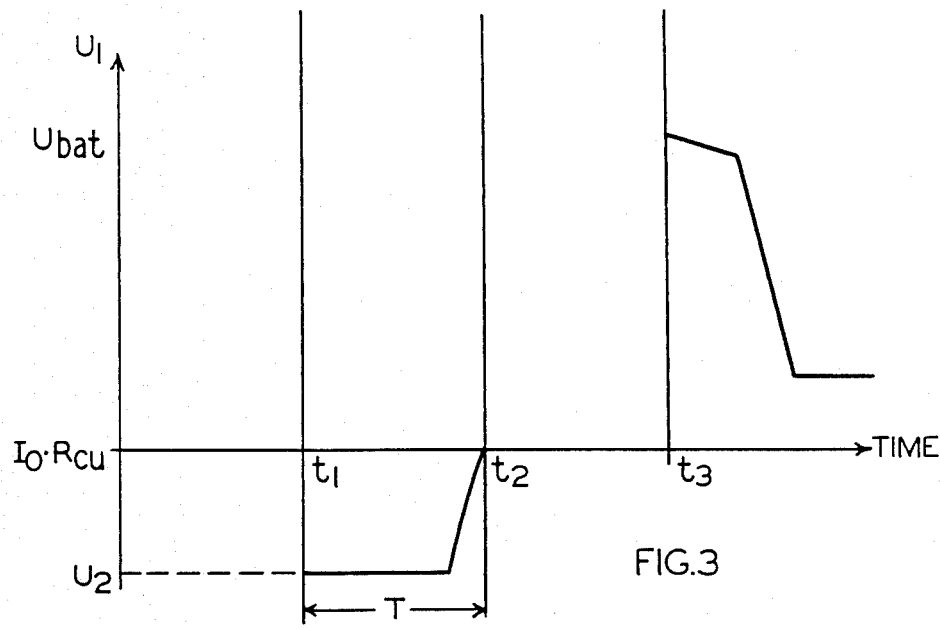
FIG. 3 is a graphic ilustration of the coil voltage versus time.
Figure 4:
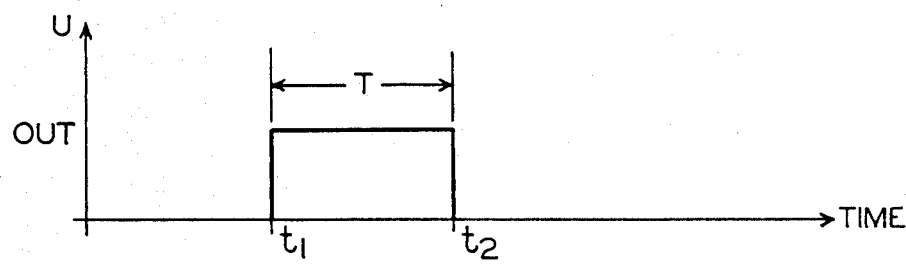
FIG. 4 is a graphic illustration of the output voltage versus time.

The initiation for measuring the displacement or position of the core is started by opening the switch 6 at the time $t_1$, as shown in FIGS. 2, 3, and 4. The start signal (START) is produced at regular intervals by a suitable microcomputer, not shown. When the switch is opened, the current $I_1$ passing through the coil 5 at first continues to flow from the voltage source 2 and through the diode 9. The coil voltage is limited to a value of $U_2$, which is 10 volts by the voltage source 2.

Now, when the current $I_1$ drops to a zero level at time $t_2$, as shown in FIGS. 2 and 3, the diode 9 exhibits a relative resistance value and separates the inductive coil 5 from the voltage source 2. Consequently, the voltage $U_1$ drops to zero voltage level.

Now, at time $t_3$, the circuit is reactivated by turning the current $I_1$ back ON by the closing of the switch 6 by the microcomputer. Now, as the steady-state current value $I_O$ is built up, a declining voltage starting with the voltage value $U_{bat}$ appears at the coil 5.

Assuming that the inductance of the inductor L is ideal, the decay time T of the coil current $I_1$ is equal to T.

Where:

$$T = I_0 \cdot (L/U_2)$$

Since current $I_O$ and voltage $U_2$ are constant, the duration of the decay time T is a direct measure of the inductance L of the coil 5. It will be appreciated that the inductance L, in turn, is directly related to the position of the iron core within the coil 5.

The operational amplifier 4, which is connected as the comparator switches through for as long as the diode 9 exhibits a low resistance from $t_1$ to $t_2$, is shown in FIG. 4. Accordingly, the duration of the output signal OUT is a direct measure for the time T. The actual measurement of the value T, as well as the subsequent evaluation, can be determined by means of a microcomputer, not shown, which is connected to the output signal OUT or pulse width modulation (PWM) output.

The coil 5, in addition to possessing the actual inductance L, also has a winding resistance of $R_{cu}$. This resistance causes a voltage drop which adds up to the voltage of $U_2$ during the decay phase of the current $I_1$, so that it reduces the time T. If the sensor is heated, the winding resistance $R_{cu}$ of the coil 5 increases and the time T again diminishes. However, if the permeability of the magnetic circuit increases, it leads to an increase in the inductance L and thus to an extension of the time T. The error which occurs due to the temperature sensitivity of the winding resistance $R_{cu}$ is, therefore, partially compensated by the error occurring due to the temperature sensitivity of the inductance L. Thus, there is no need for any external compensation such as a negative temperature coefficient (NTC) thermistor.

Figure 6:
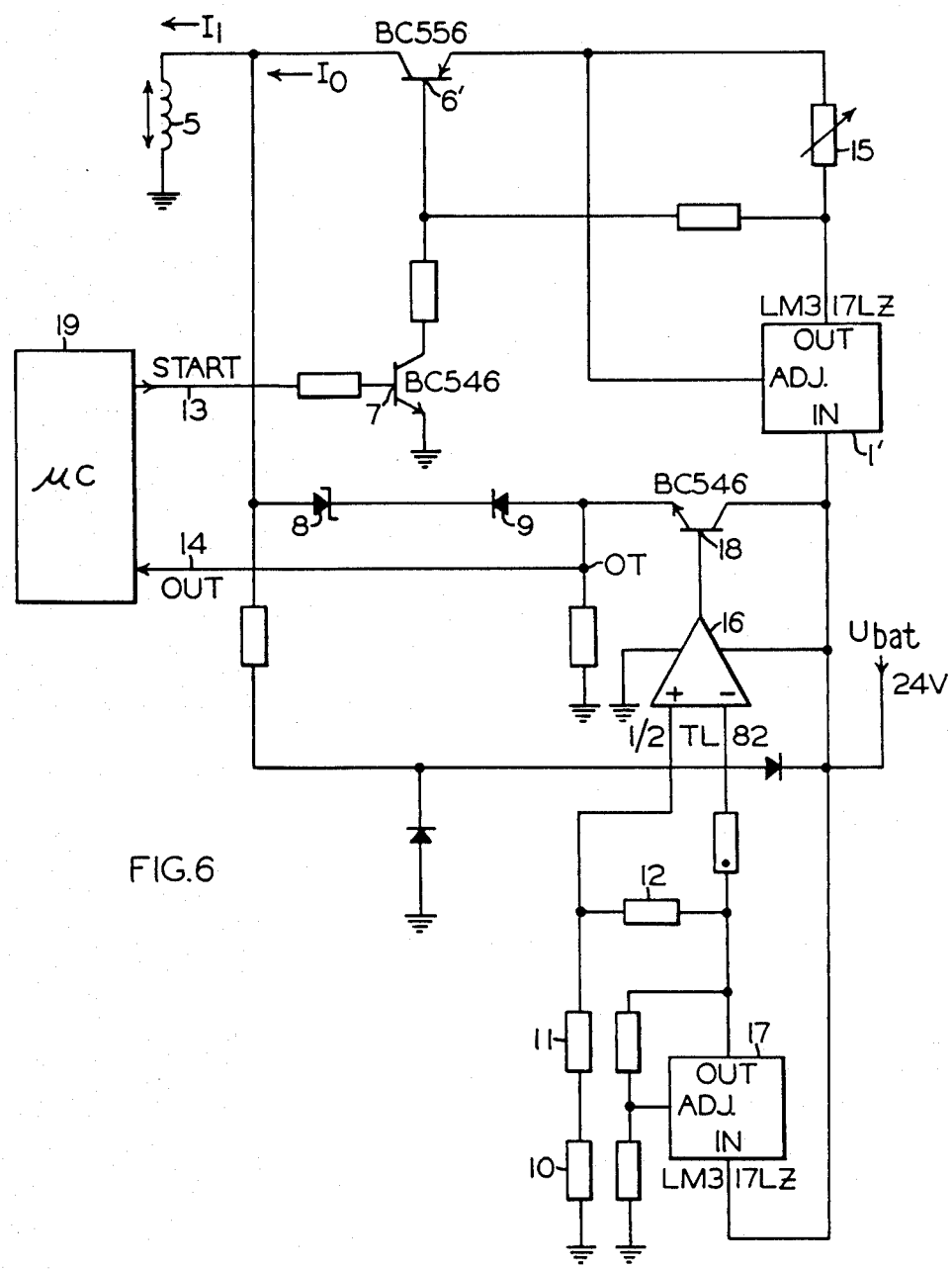
FIG. 6 is a schematic circuit diagram of an electronic displacement sensor for measuring the inductance of a magnetic coil.

It will be seen that FIG. 6 shows an actual electrical circuit operating in accordance with the principles of the invention and encompassing the functions of the block diagram according to FIG. 1.

There is shown an integrated circuit regulator 1' of type LM317LZ, manufactured by National Semiconductor Corporation, located in Santa Clara, Calif. The regulator 1' serves as the current limit or constant current source 1 of FIG. 1 for supplying the current $I_1$ to the coil 5. It will be observed that a PNP switching transistor 6', such as a type BC556, serves the same function as the switch 6 of FIG. 1. This switching transistor 6' is controlled by an additional power NPN transistor 7, such as a type BC546. The negative coil voltage existing during the time the current $I_1$ is turned OFF is limited to the value $U_2$ by means of an integrated circuit operational amplifier 16, such as a type TL82, manufactured by Texas Instruments Incorporated, located in Dallas, Tx. The negative cut-off voltage at the coil 5 is raised to the positive level of the output of the operational amplifier 16 by a Zener diode 8, such as a type ZPD18. As shown, the negative (−) input terminal of the operational amplifier 16 is connected to the negative cut-off voltage by means of a voltage divider network including resistors 10, 11, and 12. This is achieved without the use of any other Zener diode in order to avoid any additional errors due to the temperature sensitivity of such a diode. Further, the positive (+) input terminal of the operational amplifier 16 is connected to the upper end of the series-connected resistors 10 and 11.

As shown, the output signal derived from the operational amplifier 16 is amplified by a transistor 18, such as a type BL546. A diode 9, such as a type 1N918, separates the constant current $I_1$ from the displacement measuring circuit.

An integrated circuit 17, such as a type LM317LZ, serves and functions as the additional voltage source comparable to source 3 as shown in FIG. 1.

The required start signal for initiating a measuring procedure is generated by a suitable microcomputer 19 and takes the form of a negative voltage which is fed to the input line 13 and designated as START. A positive voltage pulse having a duration equal to the decay time T can then be picked off at the cathode electrode of the Zener diode 8 or at the output terminal OT according to reference voltage on line 14 and designated as OUT in FIG. 6.

The balancing of the coil current $I_O$ can be accomplished by varying the adjustable resistance 15, which is connected to the output of the constant current source 1'. A balance of the reference voltage at the positive (+) input of the operational amplifier 16 is performed by varying values of the voltage divider resistors 10, 11, and 12, which are connected to the input of the operational amplifier 16.

Figure 7:
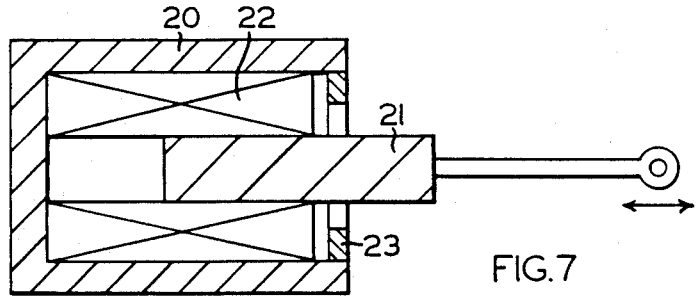
FIG. 7 is a cross-sectional view of one embodiment of an improved inductive displacement sensor which may be used with the electronic circuit of FIG. 6.

In viewing FIG. 7, there is shown a cross-sectional view of a linear electromagnetic sensor, which is suitable for measuring the displacement or position in accordance with the present invention. The sensor comprises the outer cup-shaped container 20, a linearly movable iron core 21, and an electromagnetic winding or coil 22 disposed within the container 20. It will be appreciated that the inductance of the coil of the sensor changes depending on the position of the iron core 21.

When the ambient temperature of the sensor rises, the ohmic resistance of the winding or coil 22 increases. This leads to a negative temperature coefficient phenomenon, which means that the decay or discharge time T of the inductance L is reduced (see FIG. 5).

The opposite effect occurs on the decay or discharge time T of the inductance when the magnetic permeability is increased due to the use of certain kinds of iron whose molecular structure changes at elevated temperatures. Under this condition, the discharge time T is increased (see FIG. 5).

It will be appreciated that it is not possible to compensate or vary a given winding resistance by merely selecting a particular kind of iron. This is due to the fact that the temperature coefficient is effected by the magnetic circuit, which is highly dependent on the field strength of the magnetic circuit, which is a function of the position of the movable core. When the iron core is moved outside of the coil, the effect of the air gap in the interior of the coil is stronger. When the iron core is inside the coil, on the other hand, the effect of the air gap is negligible.

Therefore, it is suitable, in principle, to choose a material with the lowest possible magnetic reluctance for the magnetic circuit. This can be achieved by selecting certain iron alloys which contain a large amount of nickel.

Figure 5:
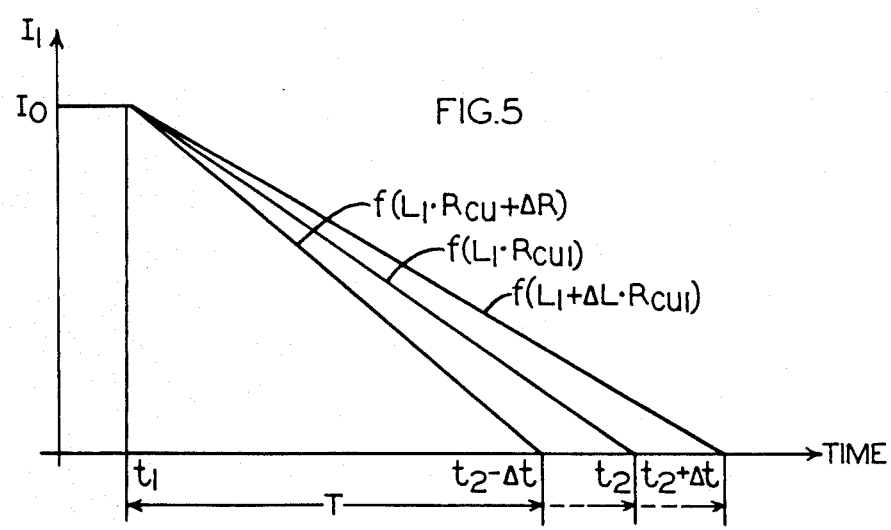
FIG. 5 is an additional graphic illustration of the coil current versus time in which the influence of the temperature is taken into account.

It is well know that not only the permeability but also the temperature sensitivity of the eddy current resistance of the magnetic circuit leads to a positive temperature coefficient. This is due to the fact that the effective resistance of the eddy current increases with increased temperatures. Therefore, the compensating effect of the eddy current action on the value of the inductance with increasing temperature is only small. This is the reason for the lengthening of the discharge time for the inductance due to the behavior of the eddy current with rising temperatures, as shown in FIG. 5.

Thus, in order to offset the negative temperature coefficient of the winding resistance, it is advantageous to control the eddy current resistance of the magnetic circuit, due to the fact that this effect does not depend on the position of the iron core.

It is, therefore, advantageous to select a material in which the eddy current resistance possesses a high temperature coefficient for the magnetic circuit elements 20 and 21. If simultaneously, as described above, a material with low magnetic reluctance is selected for the magnetic circuit, a good temperature compensation can be achieved over the entire range of iron core 21 positions, as well as over the entire range of temperatures in which the sensor will be exposed to during normal operation. Thus, the materials of the magnetic circuit and winding, as well as the number of turns in the winding, are selected in such a way that the temperature coefficients of the magnetic circuit and winding compensate for each other.

An additional possibility for affecting or increasing the eddy current resistance is provided by a separates short-circuiting or shunting ring 23. This short-circuiting ring 23 is suitably placed around the opening of the magnetic shell 20. In this position, the flux coupling between the winding 22 and the short-circuting ring 23 is independent of the displacement of the iron core 21.

Thus, the compensation occurs in the manner described above, wherein the negative temperature coefficient of the winding resistance can be compensated by means of the positive temperature coefficient of the eddy current resistance of the short-circuiting ring 23 which is independent of the position of the iron core.

By using a displacement sensor which is constructed in the above manner, it has been possible to effectively reduce the remanent temperature error to ±1%.

Thus, the present invention has been described in such full, clear, concise and exact terms as to enable any person skilled in the art to which it pertains to make and use the same, and having set forth the best mode contemplated of carrying out this invention. We state that the subject matter, which we regard as being our invention, is particularly pointed out and distinctly asserted in what is claimed. It will be understood that variations, modifications, equivalents, and substitutions for components of the above specifically-described embodiment of the invention may be made by those skilled in the art without departing from the spirit and scope of the invention as set forth in the appended claims.

We claim:

1. A circuit arrangement for measuring an inductance and, in particular, the inductance of an inductive displacement sensor, comprising:
   (a) means for supplying the inductance with a constant controlled current;
   (b) means for cutting off the constant controlled current and for limiting the cut-off voltage induced in the inductance to a given value;
   (c) means for measuring the decay time of the current flowing through the inductance;
   (d) the constant controlled current supply is connected to the inductance by means of a switch;
   (e) the means for limiting the cut-off voltage of the inductance is connected parallel to the inductance; and
   (f) detection means for measuring the cut-off voltage of the inductance.

2. The circuit arrangement, according to claim 1, wherein the limiting means comprises a voltage source and a diode connected in series.

3. The circuit arrangement, according to claim 1, wherein the detection means comprises an operational amplifier in which one input is connected to a reference voltage source.

4. The circuit arrangement, according to claim 3, wherein:
   (a) a PNP-transistor forms the switch;
   (b) an integrated circuit forms the constant current source; and
   (c) a Zener diode is used for raising the cut-off voltage of the inductance to the positive level and the output of the operational amplifier is connected to the inductance 5. The circuit arrangement, according to claim 2, wherein the voltage source comprises an integrated circuit, an operational amplifier, and a transistor.

6. The circuit arrangement, according to claim 1, wherein the displacement sensor includes a magnetic circuit and an electrical coil, and in which the materials for the magnetic circuit and the electrical coil are selected in such a way that the temperature coefficient of the magnetic circuit material and the temperature coefficient of the resistance of the electrical coil compensate for each other.

7. The circuit arrangement, according to claim 6, wherein the magnetic circuit material has an eddy current reluctance for exhibiting a positive temperature coefficient.

8. The circuit arrangement, according to claim 6, wherein the magnetic circuit material has a low magnetic reluctance.

9. The circuit arrangement, according to claim 6, wherein a short-circuiting ring is placed around the opening of a magnetic shell of the magnetic circuit.

* * * * *